(12) United States Patent
Akasaka

(10) Patent No.: US 6,490,537 B1
(45) Date of Patent: Dec. 3, 2002

(54) DATA COMMUNICATION METHOD AND DATA COMMUNICATION SYSTEM

(75) Inventor: Toshiaki Akasaka, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 83 days.

(21) Appl. No.: 09/703,716

(22) Filed: Nov. 2, 2000

(30) Foreign Application Priority Data

Nov. 10, 1999 (JP) .......................... 11-319545

(51) Int. Cl.$^7$ ............................. G06F 3/00
(52) U.S. Cl. .................. 702/118; 702/119; 702/122
(58) Field of Search ................ 702/118, 119, 702/122; 714/724; 324/753

(56) References Cited

U.S. PATENT DOCUMENTS 6,157,200 A * 12/2000 Okayasu ................ 324/753
6,289,478 B1 * 9/2001 Kitagaki ................. 714/724

FOREIGN PATENT DOCUMENTS

| JP | 59-136942 | 8/1984 |
|---|---|---|
| JP | 62-152138 | 7/1987 |
| JP | 5-121496 | 5/1993 |

OTHER PUBLICATIONS

ITU—Telecommunication Standardization Sector, Ethernet Frame Over SDH/WDM Jun. 7–18, 1999, Shaohua Yu, Peoples's Republic of China, pp. 1–13.*

Shimon Muller—Sun Microsystems Computer Company, Arquitecture for a 10–Gigabit Ethernet Standard, IEEE 802.3 High Speed Study Group Jun. 1, 1999, pp. 1–26.*

* cited by examiner

*Primary Examiner*—Marc S. Hoff
*Assistant Examiner*—Felix Suarez
(74) *Attorney, Agent, or Firm*—Oblon, Spivak, McClelland, Maier & Neustadt, P.C.

(57) ABSTRACT

A data communication method comprises the steps of transmitting, in a batch, measurement data necessary for measurement of electrical characteristics of a plurality of objects to be tested from a probing apparatus to a tester, prior to conducting a test of the electrical characteristics of the objects, the probing apparatus being connected to the tester and measuring the electrical characteristics of the objects, and transmitting, in a batch, measurement result data on two or more of the objects from the tester to the probing apparatus after the electrical characteristics of the two or more of the objects have been measured.

11 Claims, 3 Drawing Sheets

DATA COMMUNICATION METHOD AND DATA COMMUNICATION SYSTEM

CROSS-REFERENCE TO RELATED APPLICATIONS

This application is based upon and claims the benefit of priority from the prior Japanese Patent Application No. 11-319545, filed Nov. 10, 1999, the entire contents of which are incorporated herein by reference.

BACKGROUND OF THE INVENTION

The present invention relates to a data communication method and a data communication system. More particularly, this invention relates to a data communication method and a data communication system for data communication between a probing apparatus and a tester.

In a semiconductor device fabrication process, a great number of IC chips T are formed on a surface of a wafer W, as shown in FIG. 3. On the basis of results of tests of electrical characteristics of chips T on the wafer W, the chips T are screened and classified into good ones and defective ones. The tests are carried out using a probing apparatus, for example, as shown in FIG. 4. In FIG. 4, a tester 20 is connected to a probing apparatus 10 over a communication line 30. In the probing apparatus 10, chips T on a wafer W are electrically connected to the tester 20, and the tester 20 tests various electrical characteristics of the chips T.

The probing apparatus 10, as shown in FIG. 4, comprises a loading chamber 11 for feeding and prealigning a wafer W, and a probing chamber 12 for receiving the wafer W from the loading chamber 11 and testing electrical characteristics thereof. Within the probing chamber 12, there are provided a mainchuck 13 for supporting the wafer W, an aligning mechanism 14 for aligning the wafer W at a predetermined position, and a probe card 15. The probe card 15 has a plurality of probes 15A which are to be put in electrical contact with test electrodes of the chips T on the wafer W. The mainchuck 13 supporting the aligned wafer W is index-fed within the probing chamber 12. The electrical characteristics of each chip T are measured in every index-feed operation in each chip or in units of several chips. A test head 21 is disposed on a head plate 16 of the probing chamber 12. The test head 21 is electrically connected to the probe card 15.

Data communication is performed between the probing apparatus 10 (more specifically the test head 21) and the tester 20. For example, the probing apparatus 10 transmits to the tester 20 a measurement data signal indicative of the kind of a test for the wafer W placed on the mainchuck 13 (e.g. coordinates of positions of chips T on wafer W, the order of measurement, channel information on the number of chips to be tested at a time, the number of defective chips within a hatched region in FIG. 3 (i.e. the number of chips requiring no test) (hereinafter referred to as "on-wafer information") as well as a measurement start signal. After measuring the electrical characteristics of each chip T, the tester 20 transmits measurement result data along with a measurement end signal to the probing apparatus 10.

BRIEF SUMMARY OF THE INVENTION

As is shown in FIG. 4, the test head 21 and tester 20 are connected via GP-IB interface terminals and a cable (hereinafter referred to as "GP-IB line") 30 which are adopted in ordinary measuring devices. The aforementioned data such as on-wafer information, channel information and measurement result information is transmitted between the test head 21 and tester 20 over the GP-IB line 30. In some cases, the probing apparatus 10 and tester 20 are connected via, e.g. a TTL interface and a cable (hereinafter referred to as "TTL line").

With an increase in diameter of the wafer W and in integration density of chips T, the through-put has decreased more and more. Under the circumstances, it is very important to increase the speed of tests. The GP-IB line, which is currently used for general purposes, is advantageous in that a great deal of data can be transmitted at a time. However, it requires much time for communication, and high-speed communication cannot be achieved. Thus, the increase in through-put is limited. Specifically, each time the mainchuck supporting the wafer is shifted in an index-feeding manner, a measurement signal and a measurement start signal are transmitted between the probing apparatus 10 and tester 20. In addition, after the measurement is finished, measurement result data and a measurement end signal are transmitted between the probing apparatus 10 and tester 20. Where the transmission is effected over the GP-IB line 30, a time of 0.2 to 0.3 second, for instance, is needed to transmit the measurement signal and measurement result data between the tester 20 and probing apparatus 10 each time the wafer mainchuck is shifted in the indexfeeding manner. Because of this time, the through-put cannot be enhanced. On the other hand, the TTL line is suitable for high-speed data communication, but the amount of data to be transmitted is small (e.g. the data amount corresponding to 8 chips). Thus, the data for more than 8 chips cannot be transmitted.

The present invention aims at solving the above problems and transmitting a great deal of data, such as all measurement data and measurement result data relating to an object to be tested, in a batch at high speed.

The object of the present invention is to provide a data communication method and a data communication system capable of enhancing a through-put.

According to an aspect of the present invention, there is provided a data communication method for data communication in a probing apparatus connected to a tester and measuring electrical characteristics of a plurality of objects to be tested, comprising the steps of:

transmitting, in a batch, measurement data necessary for measurement of the electrical characteristics of the objects from the probing apparatus to the tester, prior to conducting a test of the electrical characteristics of the objects; and transmitting, in a batch, measurement result data on two or more of the objects from the tester to the probing apparatus after the electrical characteristics of the two or more of the objects have been measured.

In this data communication method, it is preferable that the measurement data and the measurement result data are transmitted over an Ethernet.

In these data communication method, it is preferable that before and after the electrical characteristics of the two or more of the objects are measured, a predetermined signal is transmitted between the tester and the probing apparatus over at least one of a TTL interface line and a GP-IB line.

In these data communication method, it is preferable that a measurement start signal is transmitted from the probing apparatus to the tester over the TTL interface line before the electrical characteristics of the two or more of the objects are measured, and a measurement end signal is transmitted from the tester to the probing apparatus over the TTL interface line after the electrical characteristics of the two or more of the objects are measured.

According to another aspect of the invention, there is provided a data communication system between a probing apparatus and a tester, the data communication system comprising a network for transmitting, in a batch, measurement data necessary for measurement of electrical characteristics of a plurality of objects to be tested from the probing apparatus to the tester, and for transmitting, in a batch, measurement result data on the plurality of the objects from the tester to the probing apparatus.

In this data communication system, it is preferable that the network is an Ethernet.

It is preferable that these data communication system further comprise at least one of a TTL interface line and a GP-IB line over which a predetermined signal is transmitted between the tester and the probing apparatus before and after the electrical characteristics of the two or more of the objects are measured.

It is preferable that these data communication system further comprise a TTL interface line over which a measurement start signal is transmitted from the probing apparatus to the tester before the electrical characteristics of the two or more of the plurality of the objects are measured, and over which a measurement end signal is transmitted from the tester to the probing apparatus after the electrical characteristics of the two or more of the objects are measured.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The present invention will now be described on the basis of an embodiment with reference to FIGS. 1 and 2.

Figure 1:
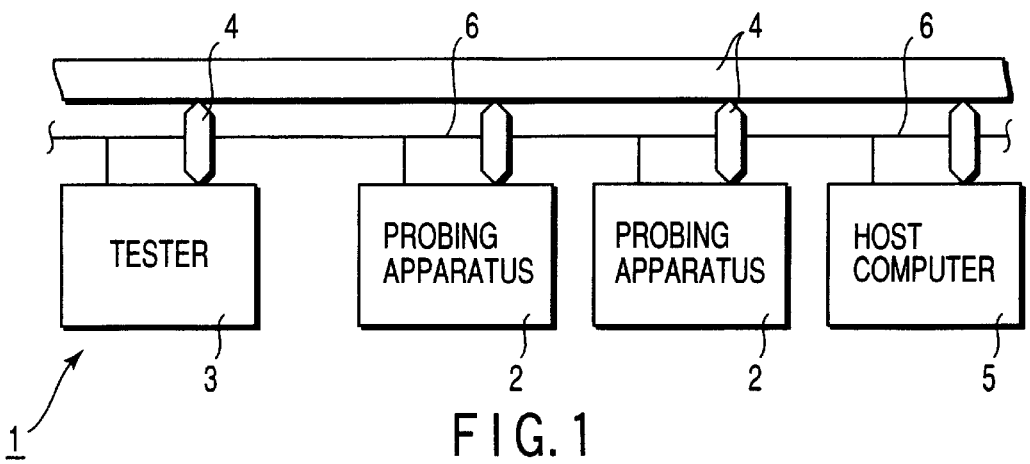
FIG. 1 illustrates a technical concept of a data communication system according to an embodiment of the present invention.
Figure 2:
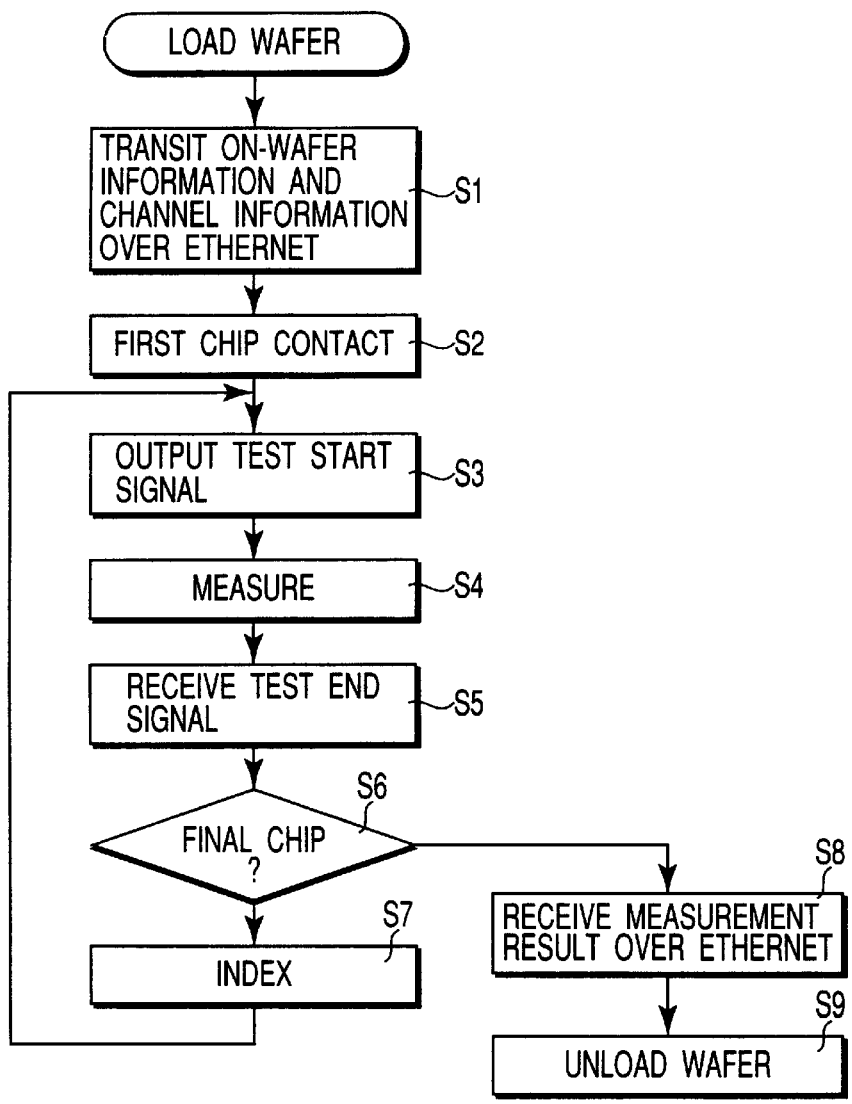
FIG. 2 is a flow chart illustrating a data communication method using the data communication system shown in FIG. 1.
Figure 3:
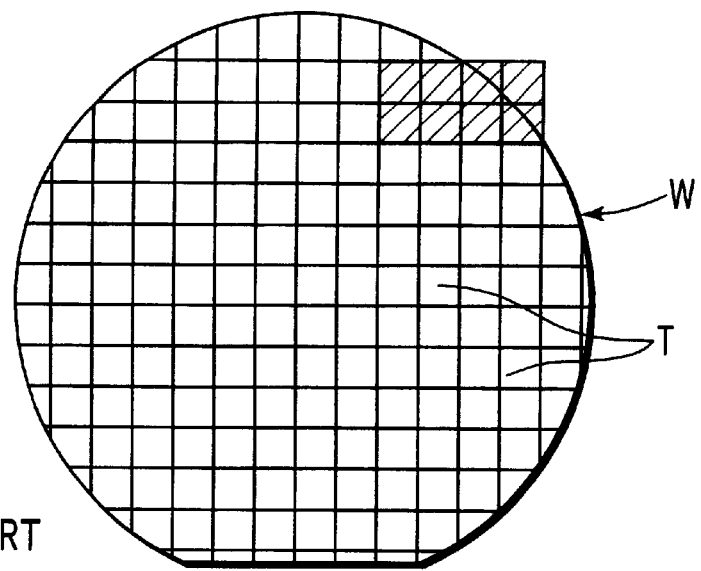
FIG. 3 is a view showing a wafer W on which a number of ICs are formed.
Figure 4:
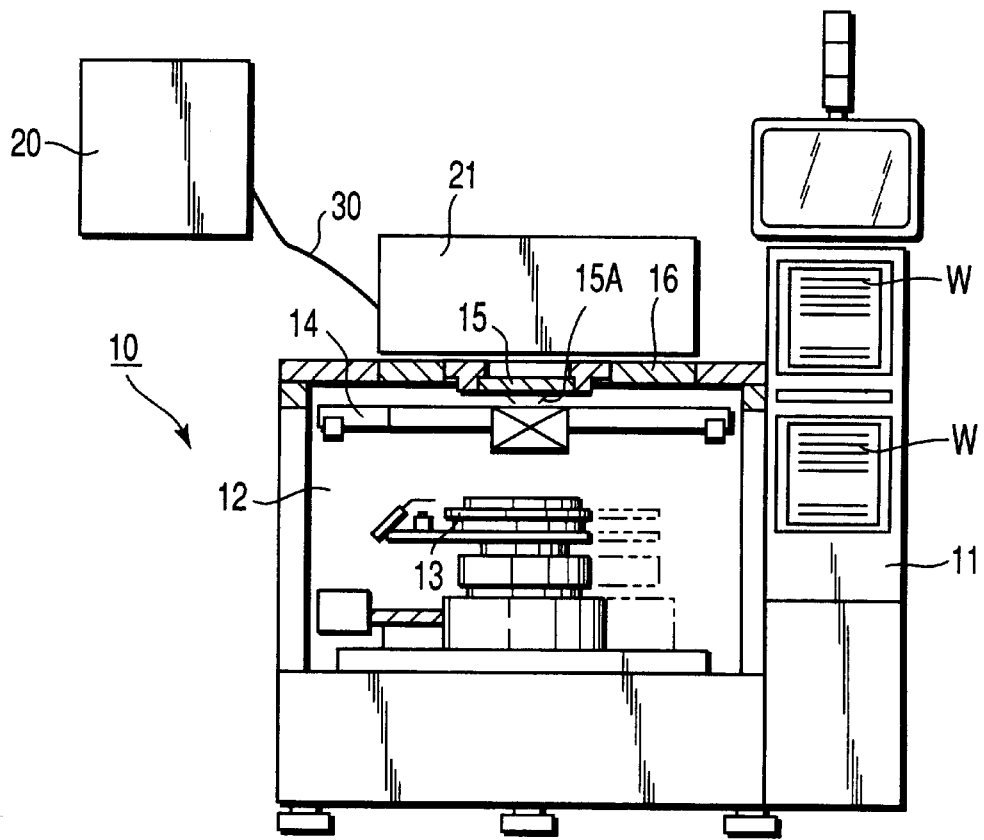
FIG. 4 shows a structural relationship between a conventional probing apparatus and a tester.

For example, as shown in FIG. 1, each probe (not shown) of the probing apparatus is put in electrical contact with each electrode of an object to be tested (e.g. chips on a semiconductor wafer (see FIG. 3)). In this state, the electrical characteristics of each chip are measured by a tester 3. In a data communication system 1 according to this embodiment, the probing apparatus 2 and tester 3 can be connected over an Ethernet 4. Data can be transmitted/received between the probing apparatus 2 and tester 3 over the Ethernet 4. In this embodiment, a great deal of measurement data necessary for measuring electrical characteristics of a object to be tested (e.g. on-wafer information relating the wafer, channel information) is transmitted in a batch from the probing apparatus 2 to the tester 3 over the Ethernet 4. After measurement of one or a plurality of chips on the wafer is finished, measurement result data obtained by the tester 3 is sent in a batch from the tester 3 to the probing apparatus 2. The probing apparatus 2 and tester 3 can be connected to a host computer 5 over the Ethernet 4. The host computer 5 stores and manages all measurement result data of each test object of the wafer.

The probing apparatus 2 and tester 3 may be connected over a TTL line 6. A less amount of data may be transmitted over the TTL line 6. For example, prior to measuring electrical characteristics of the object to be tested, a measurement start signal is sent from the probing apparatus 2 to the tester 3. In addition, after the electrical characteristics of the object are measured, a measurement end signal is sent from the tester 3 to the probing apparatus 2. Since the data amount of the measurement start signal and measurement end signal is small, these signals are transmitted over the TTL line 6.

Figure 5:
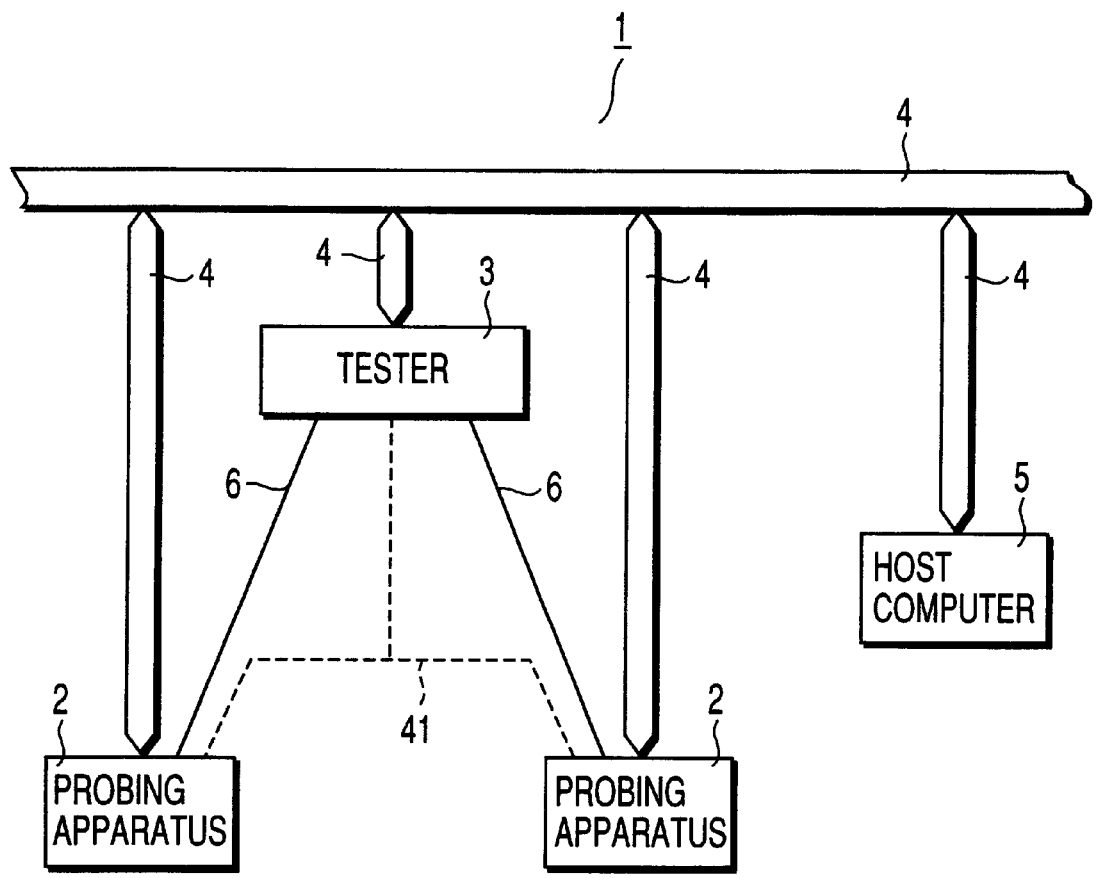
FIG. 5 illustrates a technical concert of a data communication system according to another embodiment of the present invention.

Referring to FIG. 5, another embodiment of the present invention will now be described.

In a data communication system 1 according to this embodiment, probing apparatuses 2 and a tester 3 are connected over an Ethernet 4. In this embodiment, a large amount of measurement data (e.g. data on each wafer) necessary for measuring electric characteristics of objects to be tested are transmitted in a batch over the Ethernet 4. After the object has been measured or after a plurality of the objects have been measured, measurement result data obtained by the tester 3 is also transmitted in a batch from the tester 3 to the probing apparatuses 2 over the Ethernet 4. The probing apparatuses 2 and tester 3 are connected to a host computer 5 over the Ethernet 4. The host computer 5 stores the measurement result data on all test objects and manages the data on the objects (IC chip).

The probing apparatuses 2 and tester 3 can be connected over a TTL line 6 and a GP-IB 41. A less amount of data on each object can be transmitted over the TTL line. A more amount of data can be transmitted over the GP-IB 41.

An embodiment of a data communication method according to the present invention will now be described with reference to a flow chart of FIG. 2. An object to be tested (e.g. wafer) is shifted from the loading chamber to the probing chamber and placed on the mainchuck within the probing chamber. A large amount of measurement data (e.g. on-wafer information, channel information) is transmitted at high speed in a batch from the probing apparatus 2 to the tester 3 over the Ethernet 4 (step S1). During this time, the wafer is aligned with the probes of the contacter by means of the mainchuck and alignment mechanism within the probing chamber. After the alignment, the mainchuck is moved toward the contacter and put in contact with the contacter. Further, the mainchuck is raised up to an overdrive position so that the probes of the contacter may be put in electrical contact with the electrodes of one or more chips (start chips) formed on the wafer. As a result, electric conduction is effected between the start chip and the tester 3 via the probe and the start chip is set in the measurable state (step S2). The probing apparatus 2 sends a measurement start signal at high speed to the tester 3 over the TTL line 6 (step S3). Upon receiving the measurement start signal, the tester 3 measures the electrical characteristics of the object on the basis of the measurement data (step S4). The measurement result data is stored in a memory within the tester 3. After the measurement, the tester 3 sends a measurement end signal at high speed to the probing apparatus 2 over the TTL line 6 (step S5). The probing apparatus 2 determines whether the measured chip is a final one (step S6). If it is not a final one, the wafer is index-fed by the mainchuck (step S7).

Subsequent to the index-feeding, the probes are put in contact with the electrodes of the next chip, and the operations of steps S3 to S7 are repeated. In step S6, if the measured chip is a final chip, this fact is reported from the probing apparatus 2 to the tester 3. Based on the report from the probing apparatus 2, the tester 3 sends measurement result data of one wafer in a batch to the probing apparatus 2 over the Ethernet 4 (step S8). After the probing apparatus 2 has received the measurement result data, the wafer on the mainchuck is returned from the probing chamber to the loading chamber (step S9). Then, each chip on a next wafer is measured.

Where a wafer map is formed in real time on the basis of a measured result during the test, the tester 3 may transmit the obtained measurement result data to the probing apparatus 2 at the time the index-feeding of the mainchuck has been repeated a desired number of times. According to this procedure, the wafer map can be formed in real time, and the progress of the test and the obtained measures result can be understood in real time. Where the apparatus is stopped during measurement and then the measurement is resumed, the coordinates of the position of the first chip after the resumption of measurement are reported to the tester 3 from the probing apparatus 2.

As has been described above, according to the present embodiment, measurement data (i.e. data necessary for measurement) is sent in a batch from the probing apparatus 2 to the tester 3 over the Ethernet 4 prior to a measurement operation. In addition, measurement result data on one wafer is sent in a batch from the tester 3 to the probing apparatus 2 over the Ethernet 4. As a result, the measurement data and measurement result data are transmitted using the time when the wafer is transferred between the loading chamber and the probing chamber. In addition, since there is no need to transmit the measurement result data each time the mainchuck supporting the wafer is shifted in the index-feeding manner, the communication time is shortened and the through-put increased.

According to the present embodiment, since the probing apparatus 2 and tester 3 are connected over the Ethernet 4 and TTL line 6, the data communication system can be constructed at low cost.

In the above-described embodiment, the probing apparatus 2 and tester 3 are connected over the Ethernet 4 and TTL line 6. However, this invention is not limited to this embodiment and a network line of some other LAN system is applicable to the invention. In short, the structural elements of the present invention can be modified, where necessary.

The present invention provides a data communication method and a data communication system wherein a large amount of data, such as measurement data and measurement result data can be transmitted in a batch at high speed when a test object is transferred to a measurement section and a through-put is enhanced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A data communication method for data communication in a probing apparatus connected to a tester and measuring electrical characteristics of a plurality of objects to be tested, comprising the steps of:

transmitting, in a batch, measurement data necessary for measurement of the electrical characteristics of the objects from the probing apparatus to the tester, prior to conducting a test of the electrical characteristics of the objects; and transmitting, in a batch, measurement result data on two or more of said the objects from the tester to the probing apparatus after the electrical characteristics of said two or more of the objects have been measured.

2. A data communication method according to claim 1, wherein said measurement data and said measurement result data are transmitted over an Ethernet.

3. A data communication method for data communication in a probing apparatus connected to a tester and measuring electrical characteristics of a plurality of objects to be tested, comprising the steps of:

transmitting, in a batch, measurement data necessary for measurement of the electrical characteristics of the objects from the probing apparatus to the tester, prior to conducting a test of the electrical characteristics of the objects; and transmitting, in a batch, measurement result data on two or more of the objects from the tester to the probing apparatus after the electrical characteristics of said two or more of the objects have been measured, wherein before and after the electrical characteristics of said two or more of the test objects are measured, a predetermined signal is transmitted between the tester and the probing apparatus over at least one of a TTL interface line and a GP-IB line.

4. A data communication method for data communication in a probing apparatus connected to a tester and measuring electrical characteristics of a plurality of objects to be tested, comprising the steps of:

transmitting, in a batch, measurement data necessary for measurement of the electrical characteristics of the objects from the probing apparatus to the tester, prior to conducting a test of the electrical characteristics of the objects; and transmitting, in a batch, measurement result data on two or more of the objects from the tester to the probing apparatus after the electrical characteristics of said two or more of the objects have been measured, wherein said measurement data and said measurement result data are transmitted over an Ethernet and after the electrical characteristics of said two or more of the objects are measured, a predetermined signal is transmitted between the tester and the probing apparatus over at least one of a TTL interface line and a GP-IB line.

5. A data communication method for data communication in a probing apparatus connected to a tester and measuring electrical characteristics of a plurality of objects to be tested, comprising the steps of:

transmitting, in a batch, measurement data necessary for measurement of the electrical characteristics of the objects from the probing apparatus to the tester, prior to conducting a test of the electrical characteristics of the objects; and transmitting, in a batch, measurement result data on two or more of the objects from the tester to the probing apparatus after the electrical characteristics of said two or more of the objects have been measured, wherein a measurement start signal is transmitted from the probing apparatus to the tester over a TTL interface line before the electrical characteristics of said two or more of the objects are measured, and a measurement end signal is transmitted from the tester to the probing apparatus over the TTL interface line after the electrical characteristics of said two or more of the objects are measured.

6. A data communication method for data communication in a probing apparatus connected to a tester and measuring electrical characteristics of a plurality of objects to be tested, comprising the steps of:

transmitting, in a batch, measurement data necessary for measurement of the electrical characteristics of the objects from the probing apparatus to the tester, prior to conducting a test of the electrical characteristics of the objects; and transmitting, in a batch, measurement result data on two or more of the objects from the tester to the probing apparatus after the electrical characteristics of said two or more of the objects have been measured, wherein said measurement data and said measurement result data are transmitted over an Ethernet, a measurement start signal is transmitted from the probing apparatus to the tester of a TTL interface line before the electrical characteristics of said two or more of the objects are measured, and a measurement end signal is transmitted from the tester to the probing apparatus over the TTL interface line after the electrical characteristics of said two or more of the objects are measured.

7. A data communication system between a probing apparatus and a tester, the data communication system comprising a network for transmitting, in a batch, measurement data necessary for measurement of electrical characteristics of a plurality of objects to be tested from the probing apparatus to the tester, and for transmitting, in a batch, measurement result data on said the objects from the tester to the probing apparatus.

8. A data communication system according to claim 7, wherein said network is an Ethernet.

9. A data communication system between a probing apparatus and a tester, the data communication system comprising a network for transmitting, in a batch, measurement data necessary for measurement of electrical characteristics of a plurality of objects to be tested from the probing apparatus to the tester, and for transmitting, in a batch, measurement result data on said the objects from tester to the probing apparatus, said network comprises at least one of a TTL interface line and a GP-IB line over which a predetermined signal is transmitted between the tester and the probing apparatus before and after the electrical characteristics of said two or more of the objects are measured.

10. A data communication system between a probing apparatus and a tester, the data communication system comprising an Ethernet network for transmitting, in a batch, measurement data necessary for measurement of electrical characteristics of a plurality of objects to be tested from the probing apparatus to the tester, and for transmitting, in a batch, measurement result data on said the objects from tester to the probing apparatus, wherein said network comprises at least one of a TTL interface line and a GP-IB line over which a predetermined signal is transmitted between the tester and the probing apparatus before and after the electrical characteristics of said two or more of the objects are measured.

11. A data communication system between a probing apparatus and a tester, the data communication system comprising a network for transmitting, in a batch, measurement data necessary for measurement of electrical characteristics of a plurality of objects to be tested from the probing apparatus to the tester, and for transmitting, in a batch, measurement result data on said the objects from tester to the probing apparatus, wherein said network comprises a TTL interface line over which a measurement start signal is transmitted from the probing apparatus to the tester before the electrical characteristics of said two or more of the objects are measured, and over which a measurement end signal is transmitted from the tester to the probing apparatus after the electrical characteristics of said two or more of the objects are measured.

* * * * *